FIP8102 XR 3,725,820

X5220E X 5305H
X5274D

United Sta

Kojima et al.

[11] 3,725,820

[45] Apr. 3, 1973

[54] PHOTOSENSITIVE SOLID OSCILLATOR

[75] Inventors: Kiyoshi Kojima; Toshiro Abe, both of Osaka, Japan

[73] Assignee: Matsushita Denko Kabushiki Kaisha, Osaka, Japan

[22] Filed: Jan. 17, 1972

[21] Appl. No.: 218,096

Related U.S. Application Data

[62] Division of Ser. No. 889,236, Dec. 30, 1969.

[30] Foreign Application Priority Data

Jan. 5, 1969 Japan ....................44/1264
Feb. 14, 1969 Japan ....................44/11180
Mar. 31, 1969 Japan ....................44/25113
Apr. 24, 1969 Japan ....................44/32102
Apr. 30, 1969 Japan ....................44/33831

[52] U.S. Cl. ...............331/107 R, 315/134, 315/158, 317/235 T, 317/235 N, 325/105, 331/66, 331/172

[51] Int. Cl. .................H03b 7/06

[58] Field of Search ....................331/107; 317/235

*Primary Examiner*—John Kominski
*Attorney*—Wolf, Hubbard, Voit & Osann, Ltd.

[57] ABSTRACT

A photosensitive solid oscillator, which comprises an impurity layer formed on a surface of a semi-conductor wafer, two separate impurity layers formed one the other surface of said wafer as spaced along the surface from each other, and electrodes respectively provided at least on each of the latter two impurity layers. The respective impurity layers on both surfaces of the wafer are of a reversely conducting type semiconductor with respect to said wafer and contain an impurity of higher concentration than in the wafer.

7 Claims, 31 Drawing Figures

PHOTOSENSITIVE SOLID OSCILLATOR

This is a division of application Ser. No. 889,236 filed Dec. 30, 1969.

This invention relates to photosensitive solid oscillators and more particularly to a solid oscillator in which the oscillating frequency varies with the quantity of a light irradiated to said solid oscillator.

It is already known that there is a PN junction in a semiconductor and that, when a voltage is added to such junction in a reverse direction, an oscillation is produced.

Further, there is also known a semiconductor element having a PIN junction with an I layer which is very low in the impurity concentration. It is also known that an oscillation is produced by adding a voltage to this element. However, these elements have no photosensitivity.

It is also known that a so-called phototransistor has photosensitivity. However, in such photo transistor, only the current increases with the light but no oscillating phenomenon is produced.

An object of the present invention is to provide a new solid oscillator having a photosensitivity and oscillating phenomenon.

Another object of the present invention is to provide a solid oscillator which can be modulated by light. Further the objects of the present invention are to provide such a solid oscillator:

1. that the oscillating frequency can be varied with the impressed voltage,
2. that the frequency-modulation can be made by externally adding an impedance, capacitance or inductance,
3. that, as the oscillation starting point and stopping point can be obtained by varying the bias voltage, the frequency modulation can be made and
4. that, due to the oscillation output, a wireless or wire signal transmission is easy.

Other objects and advantages of the present invention will become clear with the perusal of the following detailed explanation with reference to the drawings.

While the invention shall be explained with reference to the embodiments as illustrated, it should be understood that the intention is not to limit the invention to the particular embodiments, but rather to cover all of modifications, alterrations and equivalent arrangement to be included in the scope of the appended claims.

Figure 1:
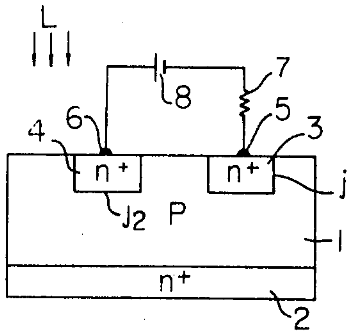
FIG. 1 shows the first embodiment of the photosensitive solid oscillator according to the present invention.

In FIG. 1 showing the first embodiment of the photosensititive solid oscillator according to the present invention, 1 is a p-type semiconductor wafer, 2 is a first impurity layer that is a n-type conductor formed on one surface of the above mentioned p-type semiconductor wafer and a layer of a concentration higher than of the wafer 1. 3 and 4 are respectively second and third impurity layers consisting of n-type semiconductors formed in two parts separated from each other on the other surface of the above mentioned wafer 1. 5 and 6 are electrodes provided respectively on the surfaces of the above mentioned impurity layers 3 and 4. A direct current source 8 is connected between the above mentioned electrodes 5 and 6 through an output resistance 7 to form an oscillating circuit.

Figure 2:
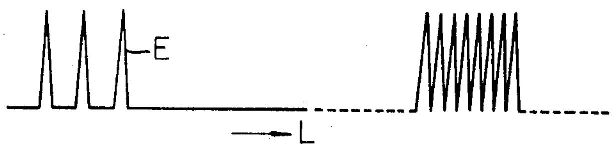
FIGS. 2 to 4 are its characteristic diagrams.

When a direct current voltage is impressed on the above mentioned photosensitive solid oscillator in the direction in the drawing and is increased, at some voltage, an oscillation occurs. In such case, if the above mentioned oscillator is irradiated with a light and the light quantity is varied, as shown in FIG. 2, with the light quantity L, the oscillating frequency $f$ of the oscillating voltage E (appearing at both ends of the output resistance 7) varies.

Figure 3:
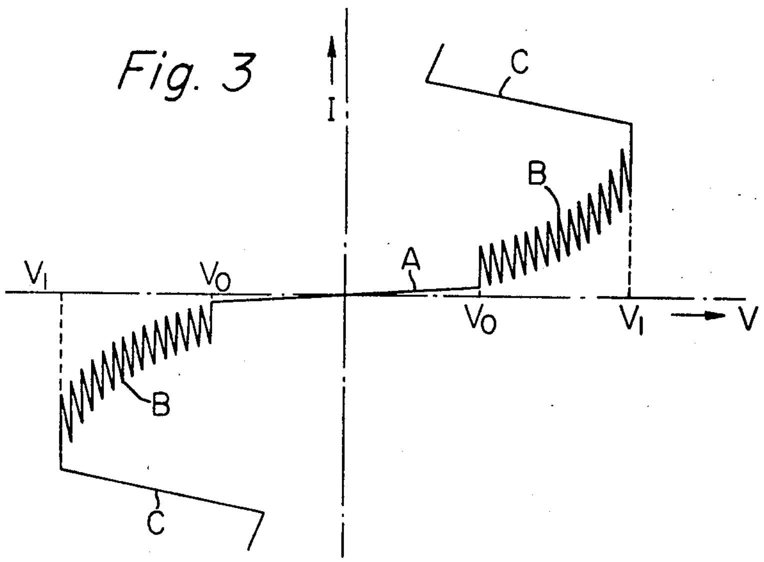

This oscillating state shall be explained with reference to FIG. 3. To the direct current voltage of such polarity as is shown in FIG. 1, the junction $j$ of the n-type semiconductor impurity layer 4 and the p-type semiconductor wafer 1 becomes a reverse junction. If a reverse direction voltage is impressed on this part, this oscillator is in a current impeding range A up to a fixed voltage. When the impressed voltage exceeds said fixed voltage, the oscillator begins to oscillate and enters an oscillating range B. When the voltage is further elevated until a voltage $V_1$ is reached, the oscillation of the oscillator stops and enters a negative resistance zone C. On the other hand, if a light is projected onto the oscillator, the oscillating zone B shifts to a lower voltage side and the oscillating characteristic of the oscillator varies. This characteristic is dipolar.

Figures 4, 5, 6:
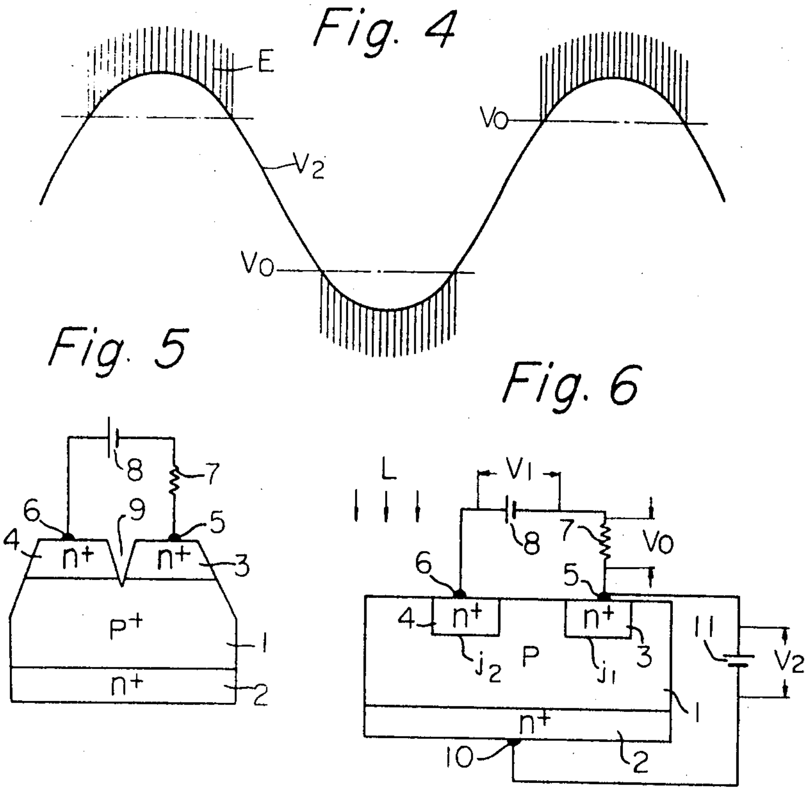
FIG. 5 shows the second embodiment of the same.
FIG. 6 shows the third embodiment of the same.

The oscillator oscillates because an avalanche occurs in the oscillating zone B. The oscillating characteristic varies with the irradiation with the light presumably because, when a reverse direction voltage is added to the P-N junction and the element is irradiated with a light, a pair of an electron and a hole occur, the electron flows to the N-type part and the hole flows to the P-type part. A carrier produced by the irradiation of a part distant from the junction with the light decreases partly by a recombination but, for example, at a point distant by about a diffusion distance $L_n$ of electron from the P-type junction, the electrons produced due to the light are so low in the rate of the recombination that they can flow to the junction. Further, as there is this light current, a few carriers from the n-type vary so as to be favorable to inject into a p-type and the injected current is amplified. Therefore, the light current and the current by this injection are added together and flew into a reverse junction. Further, with the addition of the increase of the avalanche multification rate of the electrons, the photosensitivity comes to increase. After the beginning of the oscillation, if the quantity of light to be projected onto the oscillator is varied, in response to the light quantity L, as shown in FIG. 4, the oscillating frenquency of the oscillating voltage E varies.

The above mentioned phenomenon shall be explained with reference to an actual experiment.

The p-type semiconductor wafer 1 is formed of a wafer of p-type Si of a specific resistance of 30Ω cm and thickness of 200μ, has a film of $SiO_2$ pasted on one surface and is perforated for the n-type semiconductor impurity layers 3 and 4. By diffusing phosphorus as an n-type impurity source, the n-type semiconductor impurity layers 3 and 4 of a surface concentration of 1 × 20/cm³ and thickness of about 10μμ are formed. In the same manner, the n-type semiconductor impurity layer 2 of a thickness of about 10μ is formed on the other surface of the p-type semiconductor wafer 1. The above mentioned impurity layers 3 and 4 are provided with respective Ni electrodes. Said wafer is cut to be a rectangle of 1 × 2 mm to obtain a photosensitive solid oscillator.

When a direct current voltage is impressed to the above obtained oscillator through the output resistance 7 of 2kΩ, while a light is irradiated, at a voltage of about 100 V, the oscillator begins to oscillate and thereafter, in response to the light quantity L, the oscillating frequency varies.

In the photosensitive solid oscillator according to the present invention, irrespective of the polarity of the direct current source 8, against electrodes 5 and 6 such characteristic as is mentioned above is obtained. Therefore, it can be used as an oscillator for both direct current and alternating current. Further, by impressing an alternating current voltage $V_2$, as shown in FIG. 4, an oscillating voltage can be obtained in each half cycle.

In FIG. 5 showing the second embodiment of the present invention, an n-type semiconductor impurity layer is formed by diffusion of each surface of the p-type semiconductor wafer 1 of the basic structure in FIG. 1, the n-type semiconductor impurity layers 3 and 4 are formed by mesa-etching a groove 9 on one of the layers and the other layer is made the n-type semiconductor impurity layer 2. Thus the producing step can be simplified. Further, the same as in the first embodiment, with the increase of the light quantity L, the oscillating frequency of the oscillating voltage E becomes higher but, in such case, the oscillating frequency of the oscillating voltage E for the light quantity L can be made lower.

In FIG. 6 showing the third embodiment provided with a bias electrode, 1 is a p-type semiconductor wafer, 2, 3 and 4 are respectively the same impurity layers as in the first embodiment, 5 and 6 are main electrodes, 7 is an output resistance, 8 is a direct current source, 10 is a bias electrode provided in the impurity layer 2 and 11 is a direct current source for the bias. This current source 11 is connected between the main electrode 5 or 6 in common and the bias electrode 10 so that the main electrode may be on the plus side and the bias electrode may be on the minus side.

In the above mentioned oscillator, when the main direct current source 8 is connected so as to be in a normal direction with respect to the junction $j_1$ of the n-type semiconductor impurity layer 3 and p-type semiconductor wafer 1 through the output resistance 7 between the main electrodes 5 and 6. When the voltage $V_1$ is elevated, an oscillation is started. In such case, if the oscillator is irradiated with a light and the light quantity is varied, the oscillating frequency varies with the light quantity. This state is the same as in the case of the first embodiment (shown in FIGS. 2 and 3).

Figure 7:
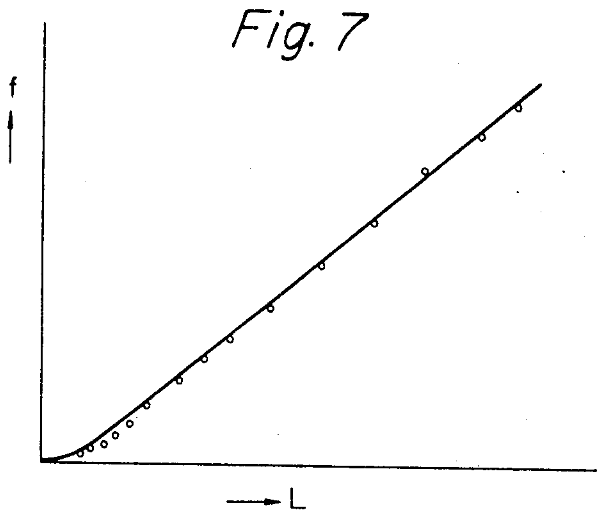
FIGS. 7 to 10 are their characteristic diagrams.
Figure 8:
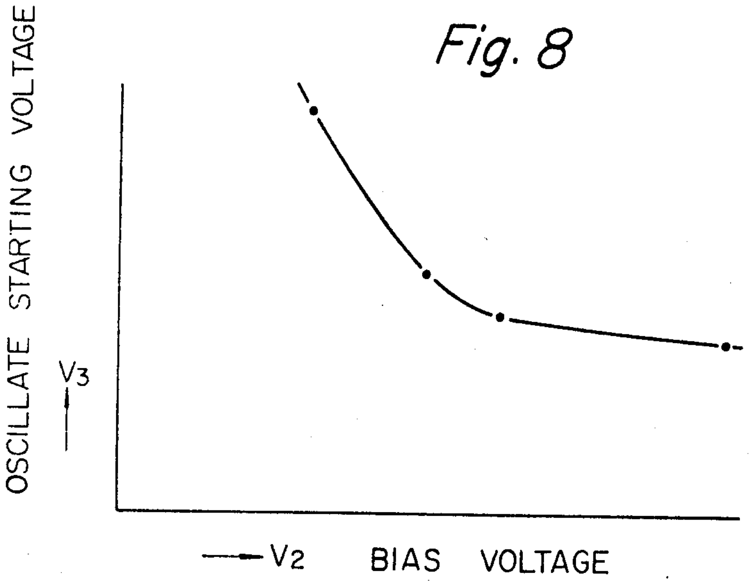
Figure 9:
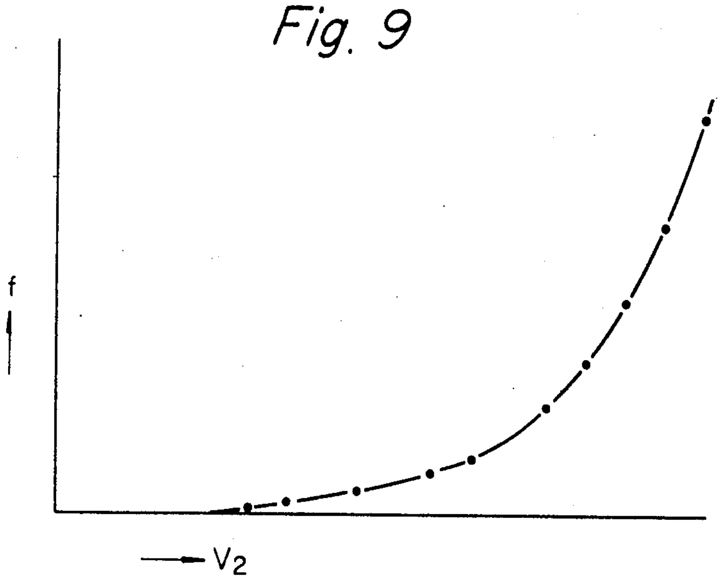

After the oscillation started, if the oscillator is irradiated with a light and the light quantity is varied, there is obtained a characteristic that the oscillating frequency $f$ of the oscillating voltage $V_c$ varies with the light quantity L as in FIG. 7. In such case, if such bias direct current source 11, as makes the n-type semiconductor impurity layer 3 positive, is connected between the electrodes 5 and 10 and the bias voltage $V_1$ is impressed, the current passing through the n-type semiconductor impurity layer varies depending on the magnitude of the voltage $V_2$, the magnitude of the main voltage $V_3$ at which the oscillator begins to oscillate varies as in FIG. 8 and the light quantity L frequency $f$ characteristic also varies greatly. Further, even if the light quantity L is constant, if the bias voltage $V_2$ is varied, the oscillating frequency $f$ varies as in FIG. 9. In such case, even if the polarity of the main voltage $V_1$ or bias voltage $V_2$ is reversed, a characteristic that the oscillation starting main voltage $V_3$ and the oscillating frequency $f$ vary by the bias voltage $V_2$ is obtained.

Figure 10:
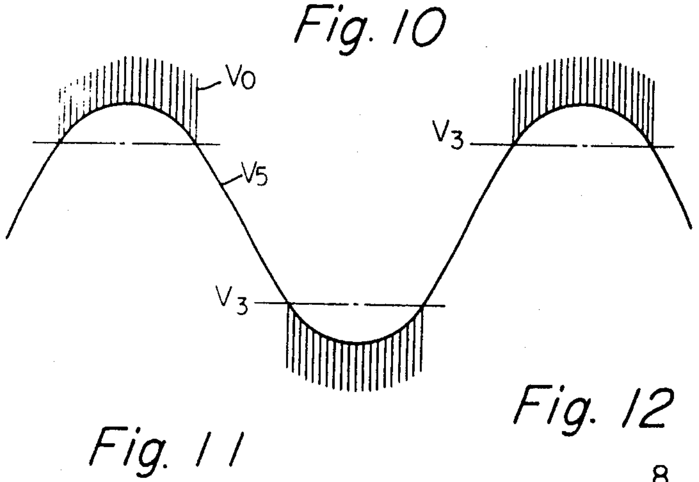

The photosensitive solid oscillator according to the present invention is formed and operates as mentioned above. There is an effect that not only, in case a main voltage larger than a constant is given, the oscillation is started and the oscillating frequency is varied with the light quantity with which the oscillator is irradiated but also, by varying the bias voltage added between the bias electrodes, the oscillation starting main voltage and light quantity-oscillating frequency characteristic is varied and, even if the light quantity is constant, by varying the bias voltage, an oscillating frequency corresponding to the bias voltage is obtained. Further, there are effects that, with the electrodes 5 and 6, irrespective of the polarity of the direct current source 8, the above mentioned characteristics are obtained, therefore it is adapted as an oscillator for alternating currents and, as in FIG. 10, by impressing an alternating current voltage $V_5$, an oscillating voltage $V_0$ can be obtained in each half cycle.

Figure 11:
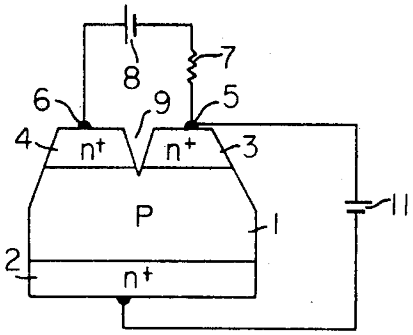
FIG. 11 shows the fourth embodiment.

In FIG. 11 showing the fourth embodiment, as in the second embodiment, a groove 9 is made by mesa-etching between the impurity layers 3 and 4. In this embodiment, the oscillating frequency $f$ of the oscillating voltage $V_0$ becomes higher with the increase of the light quantity L but, as compared with the embodiment shown in FIG. 6, the oscillating frequency of the oscillating voltage $V_0$ with the same light quantity L can be made lower.

Further, as compared with the embodiment shown in FIG. 1, there is an additional effect that the oscillating frequency $f$ of the oscillating voltage $V_0$ with the same light quantity L can be made lower.

These shall be explained with reference to an actual experiment. The p-type semiconductor impurity wafer 1 is formed of a wafer of $p$ type Si of a specific resistance of 30Ω cm. and thickness of 250μ, has a film of $SiO_2$ pasted on one surface, is painted with a resist, is perforated for the n-type semiconductor impurity layers 3 and 4 and has phosphorus selectively diffused as an n-type impurity source to obtain n-type semiconductor impurity layers 3 and 4 of a surface concentration of $1 \times 10^{20}$ -cm. and thickness of about 10μ. In the same manner, the p-type semiconductor impurity wafer 1 has an n-type semiconductor impurity layer 2 of a thickness of about 10μ formed on the other surface to obtain a photosensitive solid oscillator. When a direct current voltage is impressed to such oscillator through an output resistance 8 of 2 KΩ, the oscillator begins to oscillates at a voltage of about 100 V while it is not irradiated with a light and thereafter a characteristic that the oscillating frequency $f$ varies with the light quantity L is obtained. When a bias voltage $V_2$ is added between the bias electrodes 5 and 10 with such wiring as is shown in FIG. 6 and the voltage is increased, the oscillation starting main voltage $V_3$ becomes smaller, for example, as in the following table.

| | | | | |
|---|---|---|---|---|
| $V_2$ | 5V | 8V | 10V | 16V |
| $V_3$ | 50V | 30V | 25V | 22V |

Further, the polarity of each semiconductor layer forming the above mentioned photosensitive solid oscillator may be reverse. For example, there is obtained a semiconductor impurity wafer 1 in which the $n$ layer is of a specific resistance of 300Ω -cm. and thickness of 300 and each of the semiconductor impurity layers 2, 3 and 4 on both surfaces is formed of a $p+$ layer of a surface specific resistance of $1 \times 10^{-3}$Ω -cm. and diffusion depth of about 10μ doped with boron to a high concentration.

Further, in FIG. 11, a impeadunce (for example a condenser, a inductance, a resistance or its combination can) be used instead of direct current source 11.

Figure 12:
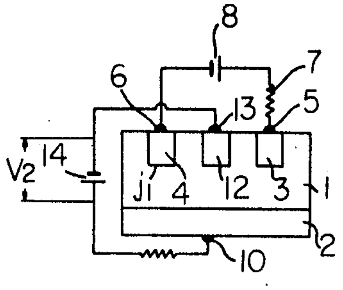
FIGS. 12 and 13 show the fifth embodiment of the same.
Figure 13:
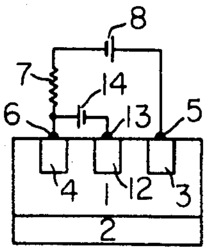

In FIG. 12 showing the fifth embodiment, the first impurity layer 2 of an n-type semiconductor of a concentration higher than of the water 1 is formed on one surface of the p-type semiconductor wafer 1 and n-type semiconductor impurity layers 3, 4 and 12 are provided on the other surface of the wafer 1 so as to be the second, third and fourth impurity layers. The second and third impurity layers 3 and 4 are provided respectively with main electrodes 5 and 6. The fourth impurity layer 12 is provided with an auxiliary electrode 13. The first impurity layer 2 is provided with a bias electrode 10. A main direct current source 8 is connected between the main electrodes 5 and 6 through the output resistance 7 so as to be in a normal direction with respect to the junction $j_1$ of the n-type semiconductor impurity layer 4 and p-type semiconductor wafer 1. When a main voltage $V_1$ is impressed on it and is elevated, at a certain voltage, the oscillator begins to oscillate and an oscillating voltage $V_0$ is obtained at both ends of the output resistance 7. In such case, if the main voltage $V_1$ is varied, the oscillator is irradiated with a light from the electrode side and light quantity is varied, the oscillating frequency $f$ varies with the main voltage $V_1$ and the light quantity L. Then, by adding a voltage between the auxiliary electrode 13 and the other electrode, the oscillating frequency $f$ can be controlled. (See FIG. 13.) This shall be explained with reference to an actual example.

Figure 14:
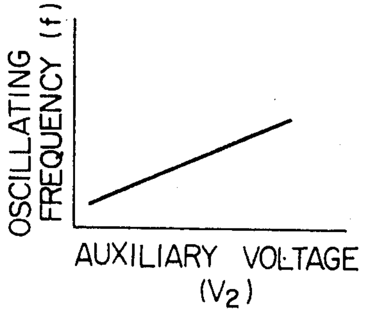
FIGS. 14 and FIG. 15A and FIG. 15B are characteristic diagrams of the fifth embodiment of the same.
Figure 15A:
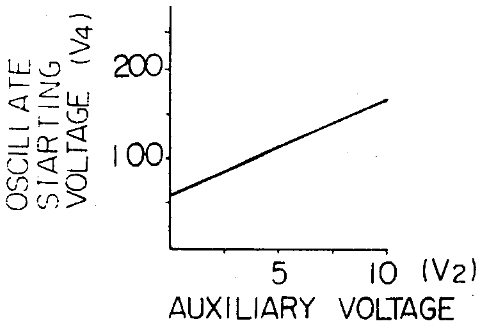
Figure 15B:
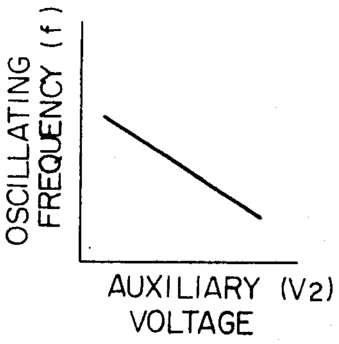

A p-type silicon wafer 1 of a specific resistance of 20Ω - cm. has a film of $SiO_2$ pasted, and is perforated by photoetching on one surface, and has SiO removed on all the other surface, and has an n-type semiconductor impurity diffused on all one surface and selectively on the other surface to form n-type semiconductor impurity layers 2, 3, 4 and 12, and has further an $SiO_2$ film pasted, and is perforated by photoetching in $SiO_2$ and has the n-type semiconductor impurity layers 2, 3, 4 and 12 provided respectively with ohmic electrodes 10, 5, 6 and 13 to form a solid oscillator. In such solid oscillator, when the output resistance 7 is made to be of 2KΩ and the main voltage $V_1$ of the direct current source 8 is impressed between the main electrodes 5 and 6 and is elvated, at the main voltage $V_1$ of about 150V., the solid oscillator begins to oscillate and an oscillating voltage $V_0$ of a high frequency is obtained at both ends of the output resistance 7. When the main voltage $V_1$ is further elevated, the oscillating frequency $f$ becomes higher. Now, when the main voltage $V_1$ is kept constant at 200V., an auxiliary current source 14 is connected between the main electrode 6 and auxiliary electrode 13 (See FIG. 13.) and the auxiliary voltage $V_2$ is varied, there is obtained such characteristic that the oscillating frequency $f$ becomes higher with the increase of the auxiliary voltage $V_2$ as in FIG. 14. Then, instead of giving the auxiliary voltage $V_2$ as in FIG. 14. Then, instead of giving the auxiliary voltage $V_2$ between the main electrode 6 and auxiliary electrode 13, when an auxiliary current source 14 of the polarity shown in FIG. 12 is provided between the auxiliary electrode 13 and bias electrode 10 and the auxiliary voltage $V_2$ is varied, the oscillation starting voltage $V_4$ at which the oscillator begins to oscillate with the elevation of the main voltage $V_1$ varies and there is obtained a characteristic that the oscillation starting voltage $V_4$ rises with the rise of the auxiliary voltage $V_2$ as in FIG. 15A. In such case, if the main voltage $V_1$ is kept constant and the auxiliary voltage $V_2$ is elevated during the oscillation, the oscillating frequency reduces until the oscillation stops. This characteristic diagram is shown in FIG. 15B. In FIG. 12, instead of auxiliary current source 14, an impeadance element. (condenser, resistance, inductance or those combination) can be used.

As the solid oscillator according to the present invention is made in a five-layer structure as mentioned above and an auxiliary electrode and bias electrode are provided in addition to the main electrode, there is an effect that, by impressing a direct current voltage of a proper magnitude between the auxiliary electrode and another electrode and adjusting the magnitude of the voltage, the oscillating frequency characteristic of the solid oscillator can be simply controlled.

Figure 16:
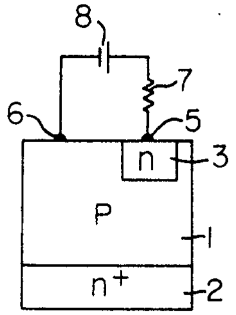
FIGS. 16 and 17 show respectively the sixth and seventh embodiments of the same.

In FIG. 16 showing the sixth embodiment of the present invention, without forming the third impurity layer in FIG. 1, an electrode 6 is provided as separated from the second impurity layer 3 directly on the surface of the semiconductor wafer 1. The electrode 6 may be an ohmic or nonohmic electrode. The properties of the semiconductor wafer 1, first impurity layer 2 and second impurity layer 3 are the same as in the case of the first embodiment.

That is to say, the semiconductor wafer 1 has the first impurity layer 2 of a semiconductor of a reversely conducting type to said wafer and of a concentration higher than of the wafer formed on one surface and is provided with the second impurity layer 3 of a semiconductor of a conducting type and a concentration higher than of the wafer on a part of the other surface. The above mentioned impurity layer 3 and semiconductor wafer 1 are provided respectively with electrodes 5 and 6.

When a voltage is impressed between the electrodes 5 and 6 of such oscillator and reaches a certain valve, an oscillation starts. In such case, if a light projected onto the oscillator from the main electrode side and the light quantity is varied, the oscillating frequency varies with the light quantity. This state is the same as in FIG. 2 of the first embodiment. The voltage-current characteristic of the oscillator is also as in FIG. 3.

An actual experiment is shown in the following. A p-type semiconductor wafer 1 is formed of a wafer of p-type Si of a specific resistance of 30Ω- cm, and thickness of 200$\mu$, has n-type impurity layers 2 and 3 of a diffusion depth of 9$\mu$ and an impurity concentration of 8 × $10^{19}$/cm$^3$. formed by selectively diffusing phosphorus on both surfaces, is provided with electrodes 5 and 6 by Ni-plating on the surfaces of the above mentioned impurity layer 3 and wafer 1 and is finely divided into rectangles of 1 × 2 mm. to obtain photosensitive solids.

Figure 17:
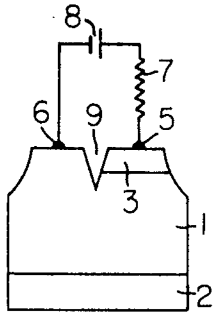

In FIG. 17 showing the seventh embodiment, a groove 9 is made by mesa-etching between the wafer 1 and impurity layer 3.

Figure 18:
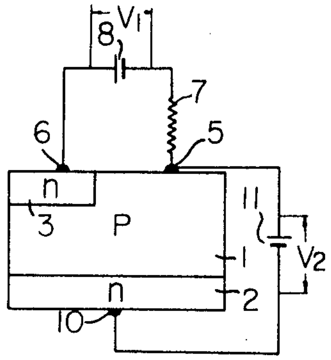
FIGS. 18 and 19 show respectively the eighth and ninth embodiments of the same.

In FIG. 18 showing the eighth embodiment, the first impurity layer 2 in FIG. 16 is provided with a bias electrode 10 and a bias current source 11 is inserted between this electrode and the electrode 5. Or, without forming the third impurity layer 4 in FIG. 6, the electrode 6 is provided directly on the surface of the semiconductor wafer 1.

When a direct current source is connected between the main electrodes 5 and 6 through the output resistance 7 and the main voltage $V_1$ is elevated, at a certain voltage, the oscillator begins to oscillate. In such case, if the oscillator is irradiated with a light and the light quantity is varied, the oscillating frequency varies. This is the same as in FIG. 7. Further, in such case, if the bias current source 11 is connected between the bias electrode 10 and the electrode 5 as illustrated and a bias voltage $V_2$ is added, depending on the magnitude of the voltage $V_2$, the oscillation starting voltage $V_3$ varies. This has the same tendency as in FIG. 8. The light quantity-oscillating frequency characteristic also varies. Further, even if the light quantity is constant, if the bias voltage $V_2$ is varied, the oscillating frequency $f$ also varies. This has the same tendency as in FIG. 9. In FiG. 18, instead of the bias current source 11, a impeadance element (condenser, inductance, resistance or those combination) can be used. Further instead of applying the bias current source 11 between the electrode 5 and 10, the bias current source or a impeadance element can be connected between the electrode 6 and 10.

Figure 19:
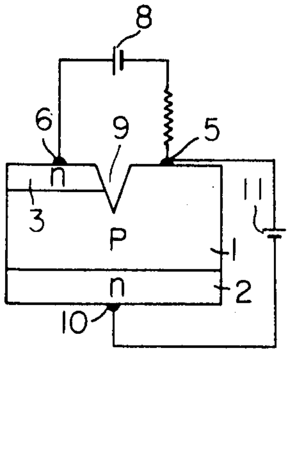

In FIG. 19 showing the ninth embodiment, a groove 9 is made by mesa-etching between the wafer 1 and impurity layer 3.

Figure 20:
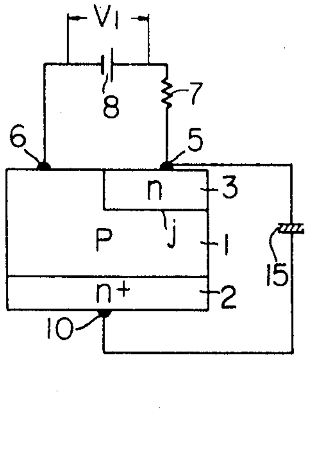
FIG. 20 shows the tenth embodiment of the same.
Figure 21:
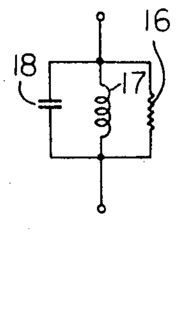
FIG. 21 shows an equivalent circuit.

In FIG. 20 showing the tenth embodiment, the formation of the elements is the same as in the case of the eighth embodiment but a condenser 15 is connected between the main electrode 5 and the bias electrode 10 and the direct current source 8 is connected on the plus side to the electrode 5 and on the minus side to the electrode 6. That is to say, the main voltage $V_1$, is impressed so as to be in a reverse direction with respect to the junction layer j of the n-type semiconductor impurity layer 3 and the p-type semiconduction wafer 1. When the voltage is elevated, at a certain voltage, the oscillator begins to oscillate and the oscillating frequency varies with the magnitude of the impressed voltage. In such case, there is obtained a characteristic that, when a light is projected onto the oscillator from the main electrode side and the light quantity is varied, the oscillating frequency varies with the light quantity L. As shown in FIG. 21, the photosensitive solid oscillator having such characteristic is substantially equalized in a parallel circuit of a negative resistance part 16 thought to be due to an avalanche, an inductance part 17 and a capacitance part 18 due to a vacant layer capacity. By externally connecting a resistance part, inductance part or capacitance part to such photosensitive solid oscillator, the oscillating condition can be varied.

Figure 22:
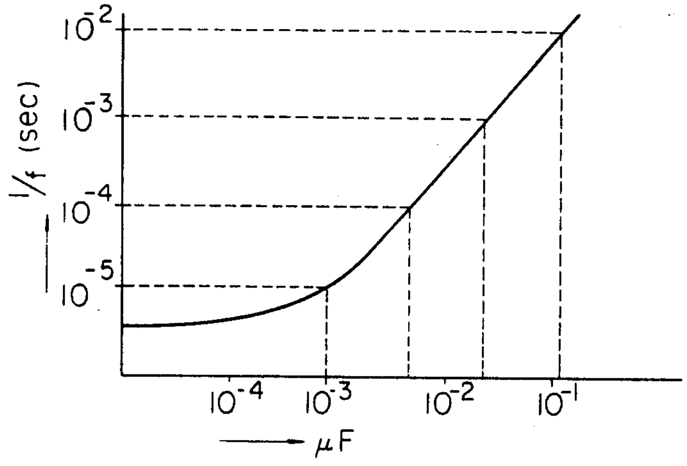
FIGS. 22 and 23 are their characteristic diagrams.
Figure 23:
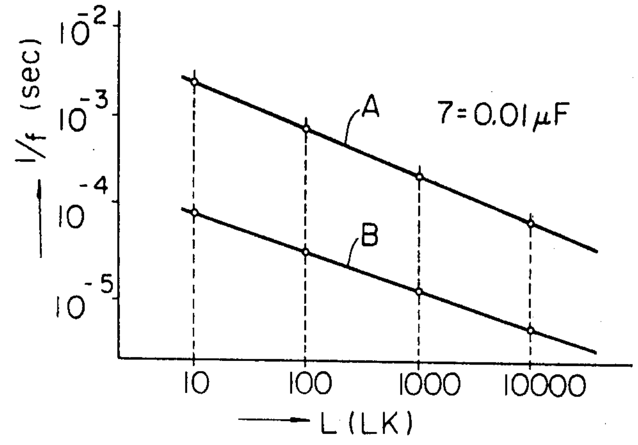

This shall be explained with reference to an actual embodiment. The p-type semiconductor wafer 1 is of an n layer of a specific resistance 350Ω - cm, each of the n-type semiconductor impurity layers 2 and 3 is an $n+$ layer of a specific resistance of 15 × $10^{-2}$Ω - cm. made by doping an n-type impurity to a high concentration and is mesa-etched, then electrodes 5, 6 and 10 are provided by nickel-plating and a condenser 15 is connected between the electrodes 5 and 10 to make a photosensitive solid oscillator. When the capacity of the condenser is determined to be 0.1$\mu$ F, the voltage to be added between the main electrodes 5 and 6 to start the oscillation reduces to about 50V whereas it is 300V in case there is no condenser 15, When the capacity of the condenser 15 is varied, there is obtained a characteristic that, as in FIG. 22, the oscillating frequency $f$ varies with the variation of the capacity $\mu$ F. Then, if the condenser capacity is kept constant and the quantity of the light L with which the photosensitive solid oscillator is irradiated is varied, as in the curve A in FIG. 23, the oscillating frequency $f$ varies with the quantity of the light L, the frequency $f$ remarkably reduces with the same light quantity as compared with such case that there is no condenser 15 as in the curve B and there is also an effect that a frequency division action is attained by the condenser 15. Further, in such case, even if the polarity of the direct current source is reversed, the characteristic curve greatly varies but substantially the same property as the above mentioned characteristic is obtained.

Figure 24:
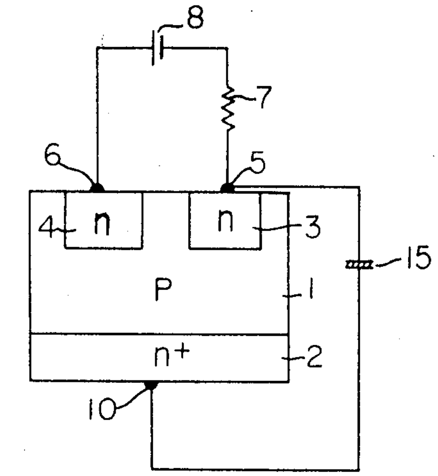
FIG. 24 shows the eleventh embodiment of the same.

Now, in FIG. 24 showing the eleventh embodiment of the present invention, an n-type semiconductor impurity layer 4 is provided on the same side as of the n-type semiconductor impurity layer 3 in the embodiment in FIG. 20 and a main electrode 6 is provided on its surface to form a four-layer structure. In the same manner as in the embodiment shown in FIG. 20, an inductance part or capacitance part is inserted between the electrodes 5 and 10 or 6 and 10 so that, by varying its magnitude, the oscillating characteristic can be controlled in the same manner as in the embodiment in FIG. 20. In such case, in the four-layer structure, irrespective of the polarity of the direct current source, the same oscillating characteristic is obtained. Thus, there is an additional effect that, in case an alternating current source is used in a light source solid oscillator, a characteristic that upper and lower half waves are symmetrical is obtained.

Further, in the above described two embodiments, it is possible to use a resistance instead of the condenser or inductance. Also, an oscillator in which two or three of them are connected in series or parallel can be used.

Further, in each of the above mentioned embodiments, the p-type semiconductor can be made an n-type semiconductor and the n-type semiconductor can be made a p-type semiconductor.

Further, a groove can be formed between the impurity layers provided on the semiconductor wafer or a part of the wafer.

Some application circuits in which the photosensitive solid oscillator of the present invention is utilized shall be explained in the following.

Figure 25:
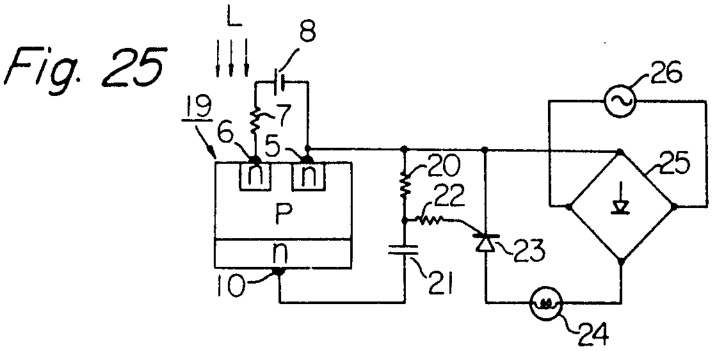
FIGS. 25 and 26 show applied circuits.

In FIG. 25 showing a thylister control circuit, 19 is a photosensitive solid oscillator, 5, 6 and 10 are its electrodes, 8 is a direct current source, 7, 20 and 22 are resistances, 21 is a condenser, 23 is a thylister, 24 is a lamp, 25 is a rectifying device and 26 is an alternating current source. In the illustrated connection, when the photosensitive solid oscillator 19 is irradiated with a light L and the quantity of the light L exceeds a fixed value L, an oscillation starts. When the light L is varied, the oscillating frequency varies. There is a characteristic that, if the irradiating light L is increased to a certain value $L_2$, the oscillation stops. An oscillating voltage is obtained from both ends of the resistance 20 and is given to the gate of the thylister 23.

In such circuit, in case the light L with which the photosensitive solid oscillator 19 is irradiated is smaller than a fixed value $L_1$, the photosensitive solid oscillator 19 does not oscillate, no oscillating voltage is obtained, no trigger signal is fed to the thylister 23, the thylister remains impeded, no current is fed to the load incandescent lamp 24 and the lamp remains unlighted. Now, when the light L exceeds the value $L_1$, the photosensitive solid oscillator 19 begins to oscillate at about 10 $KH_z$ and produces a pulse voltage of about 200 pulses in the half cycle of an alternating current voltage source 2. This oscillating voltage is impressed to the gate of the thylister 23, the thylister 23 is triggered by the pulse voltage $V_1$, the thylister 23 becomes conductive state, and a load current in a substantially all conducted state is fed to the incandescent lamp 24 to light it. When the irradiating light becomes larger, the oscillating frequency $f$ of the photosensitive solid oscillator 19 becomes higher. However, the oscillating frequency $f$ is so high that the first oscillating phase in each half cycle of the alternating current of the pulse voltage substantially synchronizes with the zero point passing phase of each cycle of the alternating current, the conducting section of the thylister remains in an all conducting state and the brightness of the incandescent lamp 24 does not substantially vary. When the irradiating light L exceeds the fixed value $L_1$, the photosensitive solid oscillator again stops the oscillation, the thylister is untriggered and returns to non-conductive state and the incandescent lamp 24 comes to be in an unlighted state.

In the above mentioned application example, the thylister can be opened and closed with the quantity of the light added to the photosensitive solid oscillator and the oscillating frequency is so high that it is possible to disconnect the light detecting part and the load circuit from each other and also to make a remote control by using an antenna or the like.

Figure 26:
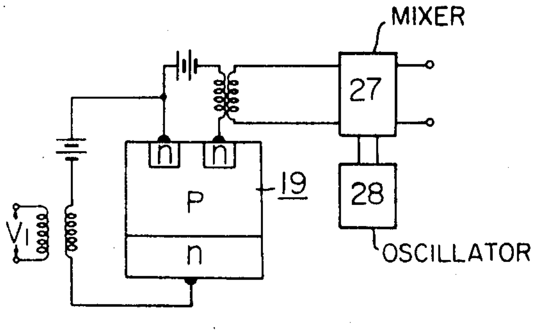

In the example of the application to a frequency-modulated circuit shown in FIG. 26, 27 is a mixer, 28 is a local oscillator, a voltage in which the oscillating frequency varies with the variation of the input voltage $V_1$ is added to the mixer 27 and is compared with the standard frequency fed from the local oscillator 28 and an output voltage $V_2$ having the difference frequency is taken out of the output end of the mixer 27.

Figure 27:
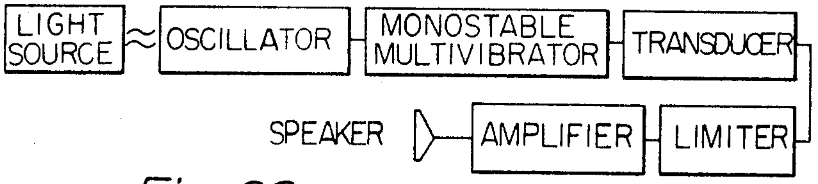
FIG. 27 shows an alaming apparatus utilizing the present invention.

The alarming apparatus shown in FIG. 27 is an apparatus wherein a light singal is converted to a frequency variation of a voltage by a photosensitive oscillator so that an oscillation output of a constant amplitude and constant width may be obtained with a monostable multivibrator, this frequency variation is changed to an amplitude variation by a voltage level transducer, and further an alarm is issued only at the time of a required light quantity by a limiter. It is so made that, at the time of the frequency-amplitude conversion, the amplitude may be small when the frequency is high but may be large when the frequency is low.

Other application examples are as follows:

Digital illuminometer:

As the frequency varies with the intensity of illumination, if this output is counted, it is an indication of a digital illuminometer as it is.

Figure 28:
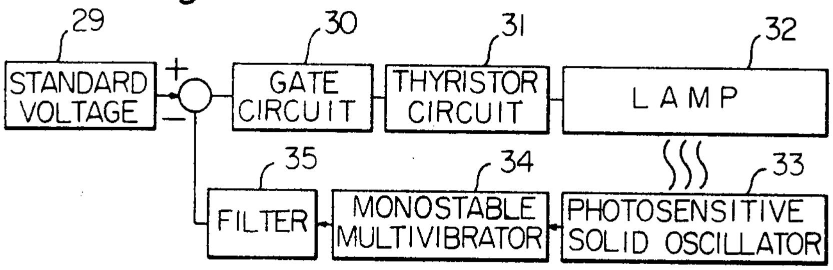
FIG. 28 is a block diagram of a dimmer utilizing the present invention.

Light controlling device:

In the block diagram in FIG. 28, 29 is a standard voltage for a desired intensity of illumination, a voltage proportional to the frequency of an oscillator 33 is made by a monostable multivibrator 34 and filter circuit 35, the difference between this output voltage and standard voltage is impressed as a control signal into a gate circuit of a thylister to control the thylister so that a room or the like may be always kept at a desired intensity of illumination.

Figure 29:
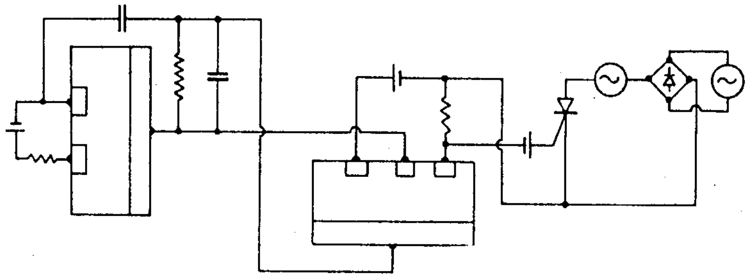
FIG. 29 shows a flasher utilizing the present invention.

Flasher:

Shown in FIG. 29 is a flasher wherein, when the light quantity is large, the oscillation is stopped but, when the light quantity is small, the oscillation output is developed so that a lamp or the like may be lighted. In this apparatus, the output of a photosensitive oscillator (or a solar battery) is filtered to be a direct current voltage and is impressed between an auxiliary electrode and bias electrode of the photosensitive oscillator and, above a certain voltage, the oscillation is stopped but, below it, the oscillation output is developed so that the thylister or the like may be ignited as a flasher.

Figure 30:
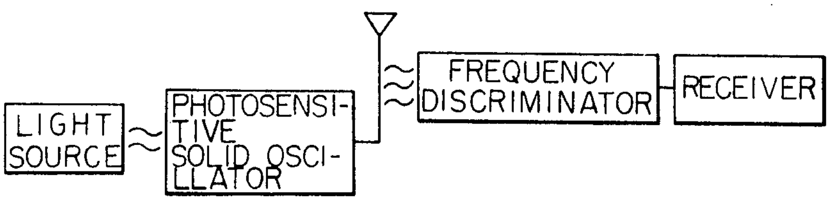
FIG. 30 is a block diagram of a remote concentrated control system utilizing the present invention.

Remote concentrated control system:

Shown in FIG. 30 is a block diagram wherein an oscillator to which a condenser or the like is externally added and which is different in the frequency is arranged, for example, in each room of a building so that the lighted or extinguished state of the illumination in each room may be known by wireless. That is to say, when the room is illuminated, a high frequency inherent in that room is developed but, when the light is extinguished, an inherent low frequency is developed and, therefore, if the frequency is properly discriminated on the receiving side, the light extinguished state in each room can be know. This can be likewise used for a fire alarm or the like.

What is claimed is:

1. A photosensitive solid oscillator comprising a semiconductor wafer, a first impurity layer formed on one surface of said wafer, said first impurity layer being of a reversely conducting type semiconductor with respect to said wafer and containing an impurity of a concentration higher than in the wafer, a second impurity layer formed on a part of the other surface of said wafer, said second impurity layer being of a reversely conducting type semiconductor with respect to said wafer and containing an impurity of a concentration higher than in the wafer, a first ohmic electrode provided on said second impurity layer and a second ohmic electrode provided on another portion of the wafer, a source voltage applied through a resistor between said electrodes and of such a polarity that causes the junction between said wafer and said second impurity layer to be a reverse junction, so that a pulse type oscillation output will be obtained at both ends of said resistor in such manner that the frequency of said output will vary depending on variations in light amount or source voltage.

2. A photosensitive solid oscillator according to claim 1 wherein said second ohmic electrode is provided on the same side of the wafer with the first ohmic electrode.

3. A photosensitive solid oscillator according to claim 1 wherein third and fourth impurity layers are provided on the same surface of the wafer with said second impurity layer, said third and fourth impurity layers being of a reverse conductive type with respect to the wafer and containing an impurity of a higher concentration than in the wafer, said second electrode being provided on said second impurity layer, a bias electrode provided on said first impurity layer, and an auxiliary electrode provided on said fourth impurity layer.

4. A photosensitive solid oscillator according to claim 1 wherein a bias electrode is provided on said first impurity layer and a bias voltage source is applied between said bias electrode and said first ohmic electrode provided on the second impurity layer.

5. A photosensitive solid oscillator according to claim 1 wherein a bias electrode is provided on said first impurity layer and a bias voltage source is applied between said bias electrode and said second ohmic electrode provided on the wafer.

6. A photosensitive solid oscillator according to claim 1 wherein a bias electrode is provided on said first impurity layer and at least one member selected from a group consisting of an inductance, condenser and resistance is connected between said bias electrode and said first ohmic electrode provided on said second impurity layer.

7. A photosensitive solid oscillator according to claim 1 wherein a bias electrode is provided on said first impurity layer and at least one member selected from a group consisting of an inductance, a condenser and resistance is connected between said bias electrode and said second ohmic electrode provided on said wafer.

* * * * *